United States Patent [19]

Stengel et al.

[11] Patent Number: 6,162,579
[45] Date of Patent: Dec. 19, 2000

[54] NITRONE COMPOUNDS AS PHOTOPOLYMER POLYMERIZATION INHIBITORS AND CONTRAST ENHANCING ADDITIVES

[75] Inventors: Kelly M. T. Stengel, Chatham; Lawrence W. Shacklette, Maplewood; Louay Eldada, Rockaway; James T. Yardley, Morristown; Chengzeng Xu, Succasunna; Scott M. Zimmerman, Basking Ridge; Keith A. Horn, Long Valley, all of N.J.

[73] Assignee: Corning Incorporated, Corning, N.Y.

[21] Appl. No.: 08/634,997

[22] Filed: Apr. 19, 1996

[51] Int. Cl.$^7$ .............................. G03F 7/031; G03F 7/09
[52] U.S. Cl. ..................... 430/272.1; 430/281.1; 430/285.1; 430/283.1; 430/917; 430/271.1
[58] Field of Search .................. 430/281.1, 285.1, 430/283.1, 917, 272.1, 271.1; 522/26, 28, 16, 18

[56] References Cited

U.S. PATENT DOCUMENTS

| | | | |
|---|---|---|---|
| 3,203,802 | 8/1965 | Burg | 430/281.1 |
| 3,988,229 | 10/1976 | Pacifici et al. | 204/159.23 |
| 4,609,252 | 9/1986 | Wong et al. | 350/96.12 |
| 4,661,433 | 4/1987 | Davis | 430/270.1 |
| 4,677,049 | 6/1987 | Griffing et al. | 430/273.1 X |
| 4,702,996 | 10/1987 | Griffing et al. | 428/500 |
| 5,176,983 | 1/1993 | Horn et al. | 430/270.1 |
| 5,219,710 | 6/1993 | Horn et al. | 430/270.1 |
| 5,468,789 | 11/1995 | Lewis et al. | 524/99 |
| 5,657,408 | 8/1997 | Ferm et al. | 385/43 |
| 5,731,128 | 3/1998 | Kanda et al. | 430/281.1 |
| 5,731,129 | 3/1998 | Koshimura et al. | 430/281.1 |

FOREIGN PATENT DOCUMENTS 0 301 559  2/1989  European Pat. Off. .

OTHER PUBLICATIONS

RN 24650–42–8, Registry File of American Chemical Society, copyright 1999 from STN database and Registry File online.

EP 0 301 559 A English Abstract (1989).

*Primary Examiner*—Cynthia Hamilton

[57] ABSTRACT

The invention provides improved high contrast, photopolymerizable compositions suitable for producing high contrast waveguides. The high contrast, photopolymerizable compositions of this invention include a nitrone compound component. The photosensitive composition is an admixture of a free radical polymerizable acrylate or methacrylate component having at least two ethylenically unsaturated groups, a photoinitiator, and a nitrone compound.

5 Claims, No Drawings

NITRONE COMPOUNDS AS PHOTOPOLYMER POLYMERIZATION INHIBITORS AND CONTRAST ENHANCING ADDITIVES

BACKGROUND OF THE INVENTION

The present invention relates to photopolymerizable compositions or more particularly to photopolymerizable compositions suitable for producing improved, high contrast waveguides. The photopolymerizable compositions of this invention include a nitrone compound component.

It is known in the art to produce optical waveguides to form interconnections between optical information processing devices, or connections between such devices and other optical communication links such as glass optical fibers. Waveguides may also be used to create passive optical devices such as splitters, combiners, couplers, routers and the like. In telecommunications applications, single-mode waveguide devices with densely packed features having extremely small dimensions are generally required. The transverse dimension of such waveguides may range from about 5 $\mu$m to about 10 $\mu$m, while the space between guides can be as little as 3 $\mu$m. It is known in the art to produce waveguides with UV photopatterned polymeric materials. In this regard, see U.S. Pat. No. 4,609,252 which is incorporated herein by reference. The ability to print images having the required dimensions, contrast and transparency depends on a number of interacting variables. These include UV exposure level, exposure time, the chemical and physical characteristics of the composition used including the activity of selected photomonomers, the spectral response of photoinitiators and the properties of any inhibitors and antioxidants which may be present.

It has been determined that conventional materials known to those of skill in the art for producing waveguides do not provide the required contrast to obtain the most desired image features. This shortcoming is particularly evident when it is required to produce images which have differing densities across a substrate which bears a photopolymerizable composition. Composition exposure methods are also important. While exposure by direct laser writing is generally effective in writing features one at a time, the more economical approach is to expose the photopolymerizable composition through a mask. However, this latter method has been found to produce unwanted partially exposed, i.e. partially polymerized regions between the image areas. Conventional additives have not been effective at providing sufficiently high contrast to stop polymerization at the boundary of exposed and nonexposed regions. Unwanted intermediate polymer gels which cannot be removed by the developing process are the result.

It has now been found that by including a free-radical polymerization inhibiting molecule containing a nitrone group in the photopolymerizable composition, a dramatic improvement in contrast results which allows the desired images to be formed using a uniform exposure through a conventional exposure mask. Without being bound to a particular theory, it is believed that the nitrone acts in two ways to overcome the difficulties encountered with conventional formulations. In the usual case, oxygen dissolved in the monomers serves as a photopolymerization inhibiting agent. In the UV exposed regions, free radicals generated by the activation of the initiator are first scavenged by the oxygen present in those regions. However, when the oxygen is consumed, polymerization proceeds. Ideally, oxygen present in the unexposed regions halts the polymerization at the boundary of the exposed regions. In the case of dense structures, the oxygen can be nearly exhausted in the confined unexposed regions between the printed features which are only a few microns wide. Ultimately, the combined diffusion of both the free radicals and the inhibiting species causes unwanted polymerization to occur in the unexposed regions as well. As a result, polymer gels are formed which destroy the intended function of the device. The nitrone is a relatively large molecule which diffuses much more slowly than oxygen, and is not subject to a concentration dictated by reaching an equilibrium with ambient conditions, but can be present in any desired amount. Furthermore, the nitrones are extremely efficient radical scavengers compared to other organic compounds used for this purpose. It has also been unexpectedly found that a further advantage can be obtained from the fact that nitrones photobleach by a process which converts them to stable and non-reactive oxaziridines. These oxaziridines do not function as radical scavengers, and once created allow the polymerization to proceed uninhibited. The peak wavelength for this photobleaching can be adjusted by the choice of substituents on the nitrone. Thus the degree and speed of bleaching can be controlled. In its unbleached state the nitrone can be engineered to absorb light which would otherwise activate the photoinitiator, and therefore initially limit the population of radicals by the dual action of light absorption and radical scavenging. A balance between the radical scavenging and light absorption mechanisms can be adjusted. Ultimately, the combined effects of radical scavenging and absorption followed by bleaching result in marked improvements in effective contrast which allows fabrication of the desired highly dense or closely spaced structures.

Nitrone containing polymers have been previously employed to form waveguides via photobleaching with a UV light (see U.S. Pat. Nos. 5,219,710 and 5,176,983). In this instance the difference in refractive index between the nitrone containing nonimage areas and oxaziridine containing image areas is used to delineate the waveguide. Nitrone containing molecules have also been used as surface layers over a photoresist to enhance contrast again via photobleaching. The use of a surface layer to enhance contrast is often not a viable process for practical applications, particularly in those applications employing liquid monomer or other components which require very accurate control of layer thickness, such as is needed for the single-mode structures described herein. The present invention uses nitrones blended in the bulk of the polymerizable composition mixture, where both its photobleaching and its radical scavenging properties can be employed together to achieve a synergistic effect.

DESCRIPTION OF THE INVENTION

The invention provides a photosensitive composition which comprises a free radical polymerizable monomer, oligomer or polymer component having at least one ethylenically unsaturated group, a photoinitiator, and a nitrone compound, wherein said photoinitiator is present in sufficient amount to initiate the free radical polymerization of said polymerizable component upon imagewise exposure to sufficient actinic radiation, wherein said polymerizable component is present in sufficient amount to provide image differentiation when the composition is imagewise exposed to sufficient actinic radiation and wherein said nitrone compound is present in an amount sufficient to inhibit free radical polymerization in the nonexposed areas when the composition is subjected to actinic radiation.

The invention also provides a photographic element comprising a substrate and the aforesaid photosensitive composition on the substrate.

The invention further provides an optical element comprising a substrate and a light transmissive image region on the surface of said substrate wherein said light transmissive image region is formed by imagewise exposing and developing the aforesaid photosensitive composition on the surface of the substrate.

The invention still further provides a process for producing an optical element which comprises applying a layer of the aforesaid photosensitive composition on a substrate, imagewise exposing said layer to sufficient actinic radiation sufficient to form imagewise exposed and imagewise nonexposed areas on the substrate, and developing said layer with a solvent developer to remove the imagewise nonexposed portions of the composition while leaving the imagewise exposed areas on the substrate.

The photopolymerizable compound may be a monomer, oligomer or polymer which is an addition polymerizable, nongaseous (boiling temperature above 30° C. at normal atmospheric pressure), ethylenically unsaturated compound containing at least one terminal ethylenically unsaturated groups, and being capable of forming a high molecular weight polymer by free radical initiated, chain propagating addition polymerization. Such are well known in the art. In the preferred embodiment, at least one of said polymerizable compounds contains at least two ethylenically unsaturated groups.

Suitable for use as polymerizable components are ethers, esters and partial esters of acrylic and methacrylic acid and of aromatic and aliphatic polyols containing preferably 2 to 30 carbon atoms, or cycloaliphatic polyols containing preferably 5 or 6 ring carbon atoms. The partial esters and esters of polyoxaalkylene glycols are also suitable. Examples are ethylene glycol dimethacrylate, diethylene glycol dimethacrylate, triethylene glycol dimethacrylate, tetraethylene glycol dimethacrylate, polyethylene glycol dimethacrylates having an average molecular weight in the range from 200 to 2000, ethylene glycol diacrylate, diethylene glycol diacrylate, triethylene glycol diacrylate, tetraethylene glycol diacrylate, polyethylene glycol diacrylates having an average molecular weight in the range from 200 to 2000, trimethylolpropane ethoxylate trimethacrylate, trimethylolpropane polyethoxylate trimethacrylates having an average molecular weight in the range from 500 to 1500, trimethylolpropane ethoxylate triacrylates having an average molecular weight in the range from 500 to 1500, pentaerythritol diacrylate, pentaerythritol triacrylate, pentaerythritol tetraacrylate, dipentaerythritol diacrylate, dipentaerythritol triacrylate, dipentaerythritol tetraacrylate, dipentaerythritol pentaacrylate, dipentaerythritol hexaacrylate, tripentaerythritol octaacrylate, pentaerythritol dimethacrylate, pentaerythritol trimethacrylate, dipentaerythritol dimethacrylate, dipentaerythritol tetramethacrylate, tripentaerythritol octamethylacrylate, 1,3-butanediol dimethacrylate, sorbitol triacrylate, sorbitol tetraacrylate, sorbitol tetramethacrylate, sorbitol pentaacrylate, sorbitol hexaacrylate, oligoester acrylates, oligoester methacrylates, glycerol di- and triacrylate, 1,4-cyclohexane diacrylate, bisacrylates and bismethacrylates of polyethylene glycols having an average molecular weight from 100 to 1500, ethylene glycol diallyl ether, 1,1,1-trimethylolpropane triallyl ether, pentaerythritol triallyl ether, diallyl succinates and diallyl adipates or mixtures of the above compounds. Preferred multifunctional acrylate oligomers include, but are not limited to acrylated epoxies, acrylated polyurethanes and acrylated polyesters. Preferred photopolymerizable compounds are aryl acrylates and aryl methacrylates. Illustrative of such aryl acrylate monomers are aryl diacrylates, triacrylates and tetraacrylates as for example di, tri and tetraacrylates based on benzene, naphthalene, bisphenol-A, biphenylene, methane biphenylene, trifluoromethane biphenylene, phenoxyphenylene and the like. The preferred aryl acrylate monomers are multifunctional aryl acrylates and methacrylates and more preferred aryl acrylate monomers are di, tri and tetra acrylates and methacrylates based on the bisphenol-A structure. Most preferred aryl acrylate monomers are alkoxylated bisphenol-A diacrylates and dimethacrylates such as ethoxylated bisphenol-A diacrylate and dimethacrylates, propoxylated bisphenol A diacrylates and dimethacrylates and ethoxylated hexafluorobisphenol-A diacrylates and dimethacrylates. The aryl acrylate monomers of choice are ethoxylated bisphenol-A diacrylate and dimethacrylates. Also useful are acrylate and methacrylate containing copolymers which are well known in the art.

The photopolymerizable compound is present in an amount sufficient to photopolymerize upon exposure to sufficient actinic radiation. The amount of the photopolymerizable compound in the composition may vary widely and amounts normally used in photopolymerizable compositions for use in the preparation of photopolymers for use as the light transmissive element of light transmissive devices may be used. The amount of photopolymerizable compound is usually from about 35 to about 99.9% by weight of the composition. In the preferred embodiment, the photopolymerizable compound is present in the overall composition in an amount of from about 80% to about 99.5% by weight, preferably from about 95 to about 99.5% based on the weight of the overall composition.

The composition further comprises at least one free radical generating photoinitiator which photolytically generates free radicals. Free radical liberating photoinitiators include any compounds which liberate free radicals on stimulation by actinic radiation. Usually the photoinitiator is a free radical generating addition polymerization initiator activated by actinic light and is preferably thermally inactive near room temperature (e.g. from about 20° C. to about 30° C.) Preferred photoinitiators nonexclusively include those described in U.S. Pat. No. 4,942,112, quinoxaline compounds as described in U.S. Pat. No. 3,765,898; the vicinal polyketaldonyl compounds in U.S. Pat. No. 2,367,660; the alpha-carbonyls in U.S. Pat. Nos. 2,367,661 and 2,367,670; the acyloin ethers in U.S. Pat. No. 2,448,828; the triarylimidazolyl dimers in U.S. Pat. No. 3,479,185; the alpha-hydrocarbon substituted aromatic acyloins in U.S. Pat. No. 2,722,512; polynuclear quinones in U.S. Pat. Nos. 2,951,758 and 3,046,127; and s-triazines in U.S. Pat. No. 4,656,272 which are incorporated herein by reference.

Suitable initiators include aromatic ketones such as benzophenone, acrylated benzophenone, 2-ethylanthraquinone, phenanthraquinone, 2-tert-butylanthraquinone, 1,2-benzanthraquinone, 2,3-benzanthraquinone, 2,3-dichloronaphthoquinone, benzyl dimethyl ketal and other aromatic ketones, e.g. benzoin, benzoin ethers such as benzoin methyl ether, benzoin ethyl ether, benzoin isobutyl ether and benzoin phenyl ether, methyl benzoin, ethyl benzoin and other benzoins. Preferred free radical initiators are 1-hydroxy-cyclohexyl-phenyl ketone (Irgacure 184), benzoin, benzoin ethyl ether, benzoin isopropyl ether, benzophenone, benzil dimethyl ketal (Irgacure 651), $\alpha,\alpha$-diethyloxy acetophenone, $\alpha,\alpha$-dimethyloxy-$\alpha$-hydroxy acetophenone (Darocur 1173), 1-[4-(2-hydroxyethoxy)phenyl]-2-hydroxy-2-methyl-propan-1-one (Darocur 2959), 2-methyl-1-[4-methylthio) phenyl]-2-morpholino-propan-1-one (Irgacure 907), 2-benzyl-2-dimethylamino-1-(4-morpholinophenyl)-butan-1-one (Irgacure 369), poly {1-[4-(1-methylvinyl)phenyl]-2-hydroxy-2-methyl-propan-1-one } (Esacure KIP), [4-(4-methylphenylthio)-phenyl]phenylmethanone (Quantacure BMS), dicampherquinone. The most preferred photoinitiators are those which tend not to yellow upon irradiation. Such photoinitiators include benzodimethyl ketal (Irgacure 651), α, α-dimethyloxy-a-hydroxy acetophenone (Darocur 1173), 1-hydroxy-cyclohexyl-phenyl ketone (Irgacure-184), and 1-[4-(2-hydroxyethoxy)phenyl]-2-hydroxy-2-methyl-propan-1-one (Darocur 2959).

The free radical generating photoinitiator is present in an amount sufficient to effect photopolymerization of the photopolymerizable compound upon exposure to sufficient actinic radiation. The photoinitiator may comprise from about 0.01% to about 10% by weight of the overall composition, or more preferably from about 0.1% to about 6% and most preferably from about 0.5% to about 4% by weight based on the total weight of the composition.

The composition further contains a nitrone containing compound. The nitrone compound is present as a photocontrast enhancing additive. The nitrone component may have the general formula $R_1-CR_2=N^+O^--R_3$, which can be substituted by a wide variety of substituents. $R_1$, $R_2$ and $R_3$ are preferably selected from hydrogen, aryl such as aromatic substituents including phenyl, naphthyl, biphenyl and the like, heteroaromatics such as pyridyl, pyrrolyl, and the like, aliphatic substituents including alkyl groups such as methyl, ethyl, propyl, butyl, tertbutyl, and the like, or combinations of such groups such as tolyl, benzyl, methylpyridyl and the like. Said groups may also be substituted by other groups such as halogens, hydroxy, alkoxy, cyano, nitro, amino, and the like. $R_1$ and $R_2$ may also together form a ring structure, and mixtures of such substituents are contemplated by the invention. In the most preferred embodiments one of $R_1$ and $R_2$ is hydrogen.

Examples of nitrones include but are not limited to N-tert-butyl alpha-phenyl nitrone (herein abbreviated, BPN), N-tert-butyl alpha-(p-nitrophenyl) nitrone (BNPN), N-phenyl alpha-phenyl nitrone (DPN), N-tert-butyl alpha-(p-cyanophenyl) nitrone, N-tert-butyl alpha-(p-chlorophenyl) nitrone, N-tert-butyl alpha-(p-methoxyphenyl) nitrone, N-tert-butyl alpha-(4-pyridyl-1-oxide), N-phenyl alpha-(p-nitrophenyl) nitrone, N-phenyl alpha-(p-cyanophenyl) nitrone, N-phenyl alpha-(p-chlorophenyl) nitrone, N-phenyl alpha-(p-aminophenyl) nitrone, N-(p-nitrophenyl) alpha-(p-methoxyphenyl) nitrone, N-(p-nitrophenyl) alpha-(p-aminophenyl) nitrone, N-(p-cyanophenyl) alpha-(p-aminophenyl) nitrone, N-(p-cyanophenyl) alpha-(p-methoxyphenyl) nitrone, N-(p-cyanophenyl) alpha-(p-hydroxyphenyl) nitrone, N-phenyl alpha(2-nitrothienyl) nitrone, dimethyl pyrroline N-oxide (DMPO), bis-(N-cyclohexyl) alpha-(p-phenylene) dinitrone, and fluoro or fluoroalkyl substituted nitrones such as N-(3,5-bistrifluoromethyl phenyl) alpha-(p-chlorophenyl) nitrone.

The contribution of the bleaching mechanism to the functioning of the nitrone is dependent on the exposure conditions consisting of the spectral distribution of the source, the intensity of the source, and the duration of exposure. The exposure conditions are further influenced by the presence of any interposing medium which will act to alter the spectral distribution of the light. Such media consist of the material of the mask (glass, quartz, etc.), any overlay or substrate, through which the light must pass, such as a polymer film (polyester, polyimide, etc.), and the monomers and other components of the polymerization mixture which will also act to filter the light as it propagates into the bulk of the layer. For a given spectral distribution, the degree of photobleaching will be determined by the relative position of the absorption peak of the nitrone. This peak absorption can be tuned by the choice of substituents, $R_1$, $R_2$ and $R_3$, via the electron donating or withdrawing nature of the substituents. By employing specific combinations of the substituents listed herein, the peak absorption can be conveniently adjusted in a range from about 250 nm to about 500 nm, preferably from about 300 nm to about 400 nm, thereby offering a means to adjust the degree of photo-bleaching which will occur during the exposure of the monomer mixture. As a general rule the preferred nitrone concentration should be less than about two times the molar concentration of the photoinitiator, and more preferably less than about one times the concentration of the photoinitiator.

The radical scavenging nature of the nitrone can be adjusted to a lesser degree by choosing substituents which might provide steric hindrance. The primary means for controlling this mechanism, however, is through an adjustment of the amount of nitrone present in the monomer mixture. Effective amounts can vary widely but preferred amounts generally lie in a range from about 0.05% to about 6% by weight of the overall composition. More preferable amounts lie in a range from about 0.1% to about 2% by weight and most preferably from about 0.1% to about 1%. The optimum concentration of a nitrone compound for contrast enhancement is dependent on the light source, the photoinitiator and its concentration. Preferably, the nitrone, at its initial concentration, has stronger absorption (and larger extinction coefficient) than the photoinitiator under UV light exposure. As employed in the present invention, the nitrone bleaches upon exposure to UV light. The bleaching rate of the nitrone should be from about 0.1% per second to about 90% per second, preferably 0.5% to 20% per second, more preferably 1.0% to 5.0% per second. It is also generally preferable that the molar amount of radical scavengers employed, including the nitrone, do not exceed the molar amount of initiator initially present in the mixture multiplied by the number of radicals produced by the activated initiator.

Various optional additives may also be added to the composition depending on the purpose and the end use of the light sensitive composition. Examples of these include antioxidants, photostabilizers, volume expanders, fillers such as for example silica, glass spheres and the like, dyes, free radical scavengers, contrast enhancers and UV absorbers. Antioxidants include such compounds as phenols and particularly hindered phenols including Irganox 1010 from Ciba-Geigy; sulfides; organoboron compounds; organophosphorous compounds; N,N'-hexamethylenebis(3,5-di-tert-butyl-4-hydroxyhydrocinnamamide) available from Ciba-Geigy under the tradename "Irganox 1098". Photostabilizers and more particularly hindered amine light stabilizers include but are not limited to poly[(6-morpholino-s-triazine-2,4-diyl)[2,2,6,6,-tetramethyl-4-piperidyl)imino]-hexamethylene [2,2,6,6,-tetramethyl-4-piperidyl)imino)] available from Cytec Industries under the tradename Cyasorb UV3346. Volume expanding compounds include such materials as the spiral monomers known as Bailey's monomer. Examples of dyes include methylene green, methylene blue, and the like. Suitable free radical scavengers include oxygen, hindered amine light stabilizers, hindered phenols, 2,2,6,6-tetramethyl-1-piperidinyloxy free radical (TEMPO), and the like. Suitable contrast enhancers include other free radical scavengers. UV absorbers include benzotriazole, hydroxybenzophenone, and the like. These additives may be included in quantities, based upon the total weight of the composition, from about 0% to about 6%, and preferably from about 0.1% to about 1%. Preferably all components of the overall composition are in admixture with one another, and most preferably in a substantially uniform admixture.

An advantage of using the nitrone in this invention is its relatively low diffusivity in its mixtures. It is therefore desirable to limit the amount of high diffusivity inhibitors such as oxygen in the mixtures. The amount of oxygen can be reduced and controlled by allowing the unsaturated compound, just prior to polymerization, to reach an equilibrium with a blanketing gaseous mixture of nitrogen and oxygen containing up to about 10% oxygen.

The composition of this invention can be used in the formation of the light transmissive element of optical devices. Illustrative of such devices are planar optical slab waveguides, channel optical waveguides, rib waveguides, optical couplers, micro-optical elements and the like which are described in more detail in U.S. Pat. Nos. 4,609,252; 4,877,717; 5,136,682; 5,481,385; 5,462,700; 5,396,350 and 5,428,468. All of the foregoing patents are incorporated herein by reference. The composition of this invention can be used in the formation of negative working photoresists and other lithographic elements such as printing plates and the like. In the more preferred embodiments of the invention, the composition is used for producing a waveguide which is of the type comprising a substrate having a waveguide strip or layer on the surface thereof. Such waveguides are formed by applying a thin or thick film of the polymerizable composition of this invention on to the surface of suitable substrate. The film may be formed by any of a number of methods known in the art, such as spin coating, dip coating, slot coating, roller coating, doctor blading, evaporation or the like.

The substrate may be any material on which it is desired to establish a waveguide including semiconductor materials such as silicon, silicon oxide, gallium arsenide, silicon nitride, glass, quartz, plastics, ceramics, crystalline materials and the like. The substrate may or may not contain other devices, either topographical features such as grooves or electrical circuits or electro-optic devices such as laser diodes. On substrates where the light transmissive region is an organic layer of lower refractive index than the substrate material, it is necessary to first form a layer of refractive index lower than the refractive index of the organic waveguide material. Such a layer is known in the art as a buffer layer and may be comprised of, for example, a semiconductor oxide, a lower refractive index polymer or a spin-on silicon dioxide glass material.

Once the photopolymerizable composition is formed onto the substrate in a thin or thick film, actinic radiation is directed onto the film in order to delineate the light transmissive region. That is, the position and dimensions of the light transmissive device is determined by the pattern of the actinic radiation upon the surface of the film on the substrate. The radiation pattern must be chosen so that the photopolymerizable composition is polymerized in the desired pattern and so that other regions of the film remain unreacted. The photopolymer of the invention is conventionally prepared by exposing the polymerizable composition to actinic radiation of the required wavelength and intensity for the required duration. As used herein "actinic radiation" is defined as light in the visible, ultraviolet or infrared regions of the spectrum, as well as electron beam, ion or neutron beam or X-ray radiation. Actinic radiation may be in the form of incoherent light or coherent light, for example, light from a laser. Sources of actinic light, and exposure procedures, times, wavelengths and intensities may vary widely depending on the desired degree of polymerization, the index of refraction of the photopolymer and other factors known to those of ordinary skill in the art. Such conventional photopolymerization processes and their operational parameters are well known in the art. Sources of actinic radiation and the wavelength of the radiation may vary widely, and any conventional wavelengths and sources can be used. It is preferable that the photochemical excitation be carried out with relatively short wavelength (or high energy) radiation so that exposure to radiation normally encountered before processing (e.g., room lights) will not prematurely polymerize the polymerizable material. Alternatively, the processing can utilize a multiphoton process initiated by a high intensity source of actinic radiation such as a laser. Thus, exposure to ultraviolet light (300–400 nm wavelength) is convenient. Also, exposure by deep ultraviolet light (190–300 nm wavelength) is useful. Convenient sources are high pressure xenon or mercury-xenon arc lamps fitted with appropriate optical filters to select the desired wavelengths for processing. Also, short wavelength coherent radiation is useful for the practice of this invention. An argon ion laser operating in the UV mode at several wavelengths near 350 nm is desirable. Also, a frequency-doubled Argon ion laser with output near 257 nm wavelength is highly desirable. Electron beam or ion beam excitation may also be utilized.

Control of the spatial profile of the actinic radiation, that is, where it falls on the layer of photopolymerizable material may be achieved by conventional methods. For example, in one conventional method, a mask bearing the desired light transmissive pattern is placed between the source of actinic radiation and the photopolymerizable composition film. The mask has transparent and opaque regions which allow the radiation to fall only on the desired regions of the film surface. Masked exposure of thin films is well known in the art and may include contact, proximity and projection techniques for printing the light transmissive pattern onto the film. Another conventional method of spatial control is to use a source of actinic radiation which comprises a directed or focused beam such as a laser or electron beam. Such a beam intersects only a small area of the photo-polymerizable material film surface. The pattern of the desired light transmissive regions is achieved by moving this small intersection point around on the film surface either by scanning the beam in space or by moving the substrate so that the intersection point is changed relative to a stationary beam. These types of exposure using a beam source are known in the art as direct-write methods. By choosing the spatial characteristics of irradiation, it is possible to create light transmissive regions on the surface of the substrate and produce slab and channel waveguides. A slab waveguide is one in which the optical wave is confined only to the plane of the film. A channel waveguide is one in which the optical wave is also confined laterally within the film. A channel structure is necessary for many nonlinear and electro-optic devices because it allows the light to be directed to certain areas of the substrate as well as providing a mechanism for splitting and combining optical waves.

By using a suitable mask and by controlling the degree of collimation of the actinic radiation used for exposure, it is also possible to create arrays of micro-optical elements such as lenses or prisms which can be designed to transmit light in a desired direction (e.g., roughly orthogonal to the substrate when used as a backlight). Such optical element arrays find utility in applications including backlights (e.g. for liquid crystal displays), projection systems, front or rear projection screens, diffusers, collimators, liquid crystal viewing screens, lighting and the like. For such application it is important to create an essentially cosmetically perfect device composed of individual elements which have sharp definition and smooth walls. The composition of the current invention can be used to enhance the critical aspects of definition and wall smoothness. See U.S. Pat. Nos. 5,481,385 and 5,462,700 for view screen structures and processes and U.S. Pat. Nos. 5,396,350 and 5,428,468 for backlights.

After the photopolymerizable composition has been polymerized to form the predetermined pattern of the photopolymer on the surface of the substrate, the pattern is then developed to remove the nonimage areas and leave behind the predetermined pattern. Any conventional development method can be used, for example, flushing with a solvent for the unirradiated composition. Such solvents include polar solvents, such as alcohols and ketones. The most preferred solvents are acetone, methanol, tetrahydrofuran and ethyl acetate.

The following non-limiting examples serve to illustrate the invention. It will be appreciated that variations in proportions and alternatives in elements of the components of the photosensitive coating composition will be apparent to those skilled in the art and are within the scope of the present invention.

EXAMPLE 1

A polymerization mixture was prepared which was comprised of two acrylate monomers, ethoxylated bisphenol-A diacrylate (EBDA) and hexanediol diacrylate (HDDA), with a molar ratio of 2:1, a photoinitiator, Irgacure® I-651, at 2% by weight, an antioxidant, Irganox® I-1010, at 0.3% by weight, and a nitrone, N-tertbutylphenyl nitrone (BPN), at 0.5% by weight. This monomer mixture was coated on a glass substrate to a thickness of 6 to 10 μm. It was found that an exposure of 40 sec through a quartz mask with light from a mercury-xenon arc lamp at 11.3 mW/cm$^2$ was sufficient to produce the desired degree of polymerization of the exposed regions. The mask was designed to produce a single-mode star coupler consisting of tapered waveguides of from 5.5 to 8.5 μm width having decreasing spacing between the guides down to 3.5 μm. Following exposure the coating was developed by flushing with acetone from end to end to produce free-standing rib waveguides of about 5 to 9 μm width. No gel was observed between guides which were further than about 25 μm apart. Guides spaced less than 25 μm apart showed evidence for certain amounts of gel between guides.

EXAMPLE 2

Comparative

A polymerization mixture was prepared as in Example 1 without the presence of the nitrone component. In this case it was found that the required exposure could be reduced to 20 seconds at the same UV light intensity as Example 1. The coating was developed and analyzed as in Example 1. The resulting product revealed the presence of substantial gel in the region where the guides came closer together than about 10 times their width, a spacing of about 50 μm. It was further observed that tips of the guides in the widely spaced regions were underdeveloped resulting in round tips and poor adhesion to the substrate. Attempts at improvement through increased exposure only resulted in more unwanted gel formation.

EXAMPLE 3

To a mixture containing 20.0 g ethoxylated bisphenol A diacrylate (EBDA), 10.0 g 1,6-hexanediol diacrylate (HDDA), 0.6 g I-651, and 0.09 g I-1010 was added 0.3 g N-tert-butyl alpha-phenyl nitrone (BPN). The mixture was vigorously stirred to completely dissolve BPN and form a homogeneous solution.

EXAMPLE 4

To a mixture containing 20.0 g ethoxylated bisphenol A diacrylate (EBDA), 10.0 g 1,6-hexanediol diacrylate (HDDA), 0.6 g I-651, and 0.09 g I-1010 was added 0.3 g N-tert-butyl alpha-(p-nitrophenyl) nitrone (BNPN). The mixture was vigorously stirred to completely dissolve BPN and form a homogeneous solution.

EXAMPLE 5

To a mixture containing 20.0 g ethoxylated bisphenol A diacrylate (EBDA), 10.0 g 1,6-hexanediol diacrylate (HDDA), 0.6 g I-651, and 0.09 g I-1010 was added 0.3 g N-phenyl alpha-phenyl nitrone (DPN). The mixture was vigorously stirred to completely dissolve BPN and form a homogeneous solution.

EXAMPLE 6

To a mixture containing 20.0 g ethoxylated bisphenol A diacrylate (EBDA), 10.0 g 1,6-hexanediol diacrylate (HDDA), 0.6 g I-651, and 0.09 g I-1010 was added 0.3 g 5,5-dimethyl-1-pyrroline N-oxide (DMPO). The mixture was vigorously stirred to completely dissolve BPN and form a homogeneous solution.

EXAMPLE 7

To a mixture containing 20.0 g ethoxylated bisphenol A diacrylate (EBDA), 10.0 g 1,6-hexanediol diacrylate (HDDA), 0.6 g I-651, and 0.09 g I-1010 was added 0.6 g N-tert-butyl alpha-phenyl nitrone (BPN). The mixture was vigorously stirred to completely dissolve BPN and form a homogeneous solution.

EXAMPLE 8

To a mixture containing 20.0 g ethoxylated bisphenol A diacrylate (EBDA), 10.0 g 1,6-hexanediol diacrylate (HDDA), 0.6 g I-651, and 0.09 g I-1010 was added 0.12 g N-tert-butyl alpha-(p-nitrophenyl) nitrone (BNPN). The mixture was vigorously stirred to completely dissolve BPN and form a homogeneous solution.

EXAMPLE 9

To a mixture containing 20.0 g ethoxylated bisphenol A diacrylate (EBDA), 10.0 g 1,6-hexanediol diacrylate (HDDA), 0.6 g I-651, and 0.09 g I-1010 was added 0.21 g N-tert-butyl alpha-(p-nitrophenyl) nitrone (BNPN). The mixture was vigorously stirred to completely dissolve BPN and form a homogeneous solution.

EXAMPLE 10

To a mixture containing 20.0 g ethoxylated bisphenol A diacrylate (EBDA), 10.0 g 1,6-hexanediol diacrylate (HDDA), 0.6 g I-651, and 0.09 g I-1010 was added 0.06 g N-tert-butyl alpha-(p-nitrophenyl) nitrone (BNPN). The mixture was vigorously stirred to completely dissolve BPN and form a homogeneous solution.

EXAMPLE 11

To a mixture containing 20.0 g ethoxylated bisphenol A diacrylate (EBDA), 10.0 g 1,6-hexanediol diacrylate (HDDA), 0.6 g I-651, and 0.09 g I-1010 was added 0.03 g N-tert-butyl alpha-(p-nitrophenyl) nitrone (BNPN). The mixture was vigorously stirred to completely dissolve BPN and form a homogeneous solution.

EXAMPLE 12

To a mixture containing 20.0 g ethoxylated bisphenol A diacrylate (EBDA), 10.0 g 1,6-hexanediol diacrylate (HDDA), 0.6 g I-651, and 0.09 g I-1010 was added 0.15 g N-tert-butyl alpha-phenyl nitrone (BPN). The mixture was vigorously stirred to completely dissolve BPN and form a homogeneous solution.

EXAMPLE 13

To a mixture containing 20.0 g ethoxylated bisphenol A diacrylate (EBDA), 10.0 g 1,6-hexanediol diacrylate (HDDA), 0.3 g I-651, and 0.09 g I-1010 was added 0.06 g N-tert-butyl alpha-(p-nitrophenyl) nitrone (BNPN). The mixture was vigorously stirred to completely dissolve BPN and form a homogeneous solution.

EXAMPLE 14

To a mixture containing 20.0 g ethoxylated bisphenol A diacrylate (EBDA), 10.0 g 1,6-hexanediol diacrylate (HDDA), 1.2 g I-651, and 0.09 g I-1010 was added 0.06 g N-tert-butyl alpha-(p-nitrophenyl) nitrone (BNPN). The mixture was vigorously stirred to completely dissolve BPN and form a homogeneous solution.

EXAMPLE 15

To a mixture containing 20.0 g ethoxylated bisphenol A diacrylate (EBDA), 10.0 g 1,6-hexanediol diacrylate (HDDA), 1.2 g I-651, and 0.09 g I-1010 is added 0.12 g N-tert-butyl alpha-(p-nitrophenyl) nitrone (BNPN). The mixture is vigorously stirred to completely dissolve BPN and form a homogeneous solution.

EXAMPLE 16

To a mixture containing 20.0 g ethoxylated bisphenol A diacrylate (EBDA), 10.0 g 1,6-hexanediol diacrylate (HDDA), 0.6 g Daracur 1178, and 0.09 g I-1010 is added 0.12 g N-tert-butyl alpha-(p-nitrophenyl) nitrone (BNPN). The mixture is vigorously stirred to completely dissolve BPN and form a homogeneous solution.

EXAMPLE 17

To a mixture containing 20.0 g ethoxylated bisphenol A diacrylate (EBDA), 10.0 g 1,6-hexanediol diacrylate (HDDA), 0.6 g I-651, 0.09 g I-1010, and a light stabilizer poly[(6-morpholino-s-triazine-2,4-diyl)[2,2,6,6,-tetramethyl-4-piperidyl)imino]-hexamethylene [2,2,6,6,-tetramethyl-4-piperidyl)imino)] available from Cytec Industries under the tradename "Cyasorb UV3346"; is added 0.06 g N-tert-butyl alpha-(p-nitrophenyl) nitrone (BNTPN). The mixture is vigorously stirred to completely dissolve BPN and form a homogeneous solution.

EXAMPLE 18

Comparative

To a mixture containing 20.0 g ethoxylated bisphenol A diacrylate (EBDA), 10.0 g 1,6-hexanediol diacrylate (HDDA) and 0.6 g I-651 was charged 0.3 g I-1010. The mixture was vigorously stirred to completely dissolve all solids and form a homogeneous solution.

EXAMPLE 19

Comparative

To a mixture containing 20.0 g ethoxylated bisphenol A diacrylate (EBDA), 10.0 g 1,6-hexanediol diacrylate (HDDA) and 0.6 g I-651 was charged 0.3 g poly[(6-morpholino-s-triazine-2,4-diyl)[2,2,6,6,-tetramethyl-4-piperidyl)imino]-hexamethylene [2,2,6,6,-tetramethyl-4-piperidyl)imino)] available from Cytec Industries under the tradename "Cyasorb UV3346". The mixture was vigorously stirred to completely dissolve all solids and form a homogeneous solution.

EXAMPLE 20

Comparative

To a mixture containing 20.0 g ethoxylated bisphenol A diacrylate (EBDA), 10.0 g 1,6-hexanediol diacrylate (HDDA) and 0.6 g I-651 was charged 0.3 g 2,2,6,6-tetramethyl-1-piperidinyloxy free radical, which is known as TEMPO. The mixture was vigorously stirred to completely dissolve all solids and form a homogeneous solution.

EXAMPLE 21

The relative photo-bleaching characteristics of various nitrones were measured by dissolving them in an inert solvent and placing them in a quartz cuvette and irradiating these solutions with UV light from a mercury-xenon lamp, as used for lithography, having an intensity of 11.3 milliwatts per square centimeter and a peak emission at a wavelength of 365 nm. UV-visible light spectroscopy was employed to assess the absorption of given nitrones at their characteristic absorption peaks in the near ultraviolet range of the spectrum. The proportional reduction in these peaks was taken as a measure of the degree of bleaching of the nitrones. The rates of bleaching of the nitrones under the stated irradiation conditions were determined as given in the Table 1:

TABLE 1

| Nitrone | Peak Absorption Wavelength (nm) | Extinction Coefficient at 342 nm ($cm^{-1}$) | Bleaching Rate at 365 nm (%/sec) |
|---|---|---|---|
| BPN | 290 | $4.2 \times 10^3$ | 2.9 |
| DPN in butyl acetate | 321 | — | 9.8 |
| BNPN in butyl acetate | 360 | $1.6 \times 10^4$ | 3.0 |
| DMPO in methanol | 233 | — | 0.16 |

Since the performance of the given nitrone as a contrast enhancer is critically related to the characteristics of the photoinitiator which is chosen, spectroscopic measurements were also made on a representative photoinitiator, Irgacure 651. Irgacure 651 was measured to have a peak absorption at 342 nm with an extinction coefficient, $\epsilon=1.2\times10^3$ $cm^{-1}$. This result taken with the information provided in Table 1 indicates that BNPN has the most attractive properties for achieving high contrast enhancement with Irgacure 651, since it possesses a peak absorption which closely approaches a peak emission wavelength of the exposure lamp (365 nm), a moderate bleaching rate geared to a normal exposure time, and a high absorption at the peak absorption wavelength for the photoinitiator (Irgacure 651).

EXAMPLE 22

In order to determine the relative efficiency of various nitrones and to elucidate the basic properties necessary for superior contrast enhancement, the performance of several different nitrones was investigated. As detailed in Table 2, various nitrones were added to a mixture of acrylate monomers, a photoinitiator, and an antioxidant. These monomer mixtures were spread on a silicon wafer under nitrogen ambient to reduce the amount of oxygen in the monomer, and were exposed through a quartz mask with light from a mercury-xenon lamp as in Example 1. The mask contained a pattern to produce waveguides of nominal width of from 5.5 to 8.5 µm which were widely spaced at one end and closely spaced at the other end (minimum spacing of 3.5 µm for guides on 12-µm centers and maximum spacing of 194.5 µm on 200-µm centers). After attempted optimization of exposure time and development, the structures produced were evaluated on the basis of the definition of the tips of the guides within the region of wide spacing and the amount of polymer gel formed between the guides within the region of close spacing.

TABLE 2

| Sample Preparation | Nitrone (1% conc. in monomer) | Bleaching Rate (%/sec) | Absorption Peak (nm) | Result of Photolithography with Thin Film (2 µm) | Result of Photolithography with Thick Film (6 µm) |
|---|---|---|---|---|---|
| Example 3 | BPN | 2.9 | 290 | Clean | Moderate gel |
| Example 4 | BNPN | 3.0 | 360 | Clean with sharp tips | Incompletely cured |
| Example 5 | DPN | 9.8 | 321 | Clean (short exposure) | Gross gel formation |
| Example 6 | DMPO | 0.16 | 233 | Gel formation | |

The results of Table 2 showed that superior performance was obtained with BPN and BNPN, although in thicker films the high absorption of the BNPN nitrone obviously prevented the proper exposure of the monomer through the thick film. Hence a second series of measurements was performed to examine the effect of concentration of the nitrone, BNPN, as given in Table 3.

TABLE 3

Effect of composition on waveguide structures

| BNPN (wt %) | I-651 (wt %) | Photolithography with Thin film (2 µm) | Photolithography with Thick Film (6 µm) |
|---|---|---|---|
| 1.1 | 2 | clean | Not cured |
| 0.7 | 2 | | Tips not cured, gap gel |
| 0.4 | 2 | clean | Tips good, gap gel |
| 0.2 | 2 | | Tips good, minimal gel in gaps |
| 0.1 | 2 | | Tips not cured, gap gel |
| 0.2 | 1 | | Tips not cured |

In this case optimal results were obtained for a lower concentration of the nitrone (0.2 percent by weight). These results were in fact superior to those provided by BPN. The better performance of BNPN was presumed to result from the fact that it has an absorption which is both closer to the peak wavelength of the lamp output and the peak absorption of the photoinitiator, Irgacure 651 (I-651).

EXAMPLE 23

Comparative

In order to judge how other types of non-photobleachable free-radical scavengers might perform against a nitrone, a series of comparative measurements were made as detailed in Table 4.

TABLE 4

| Sample Preparation | Additive Type | Concentration and Chemical Name | Result of Photolithography with Thin films (2 µm) |
|---|---|---|---|
| Example 18 | Hindered phenols | 1% I-1010 | Gross gel formation |
| Example 19 | HALS | 1% Cyasorb UV3346 | Gross gel formation |
| Example 20 | Stable free radical | 1% TEMPO | No polymerization of imaged structures |
| Example 4 | Nitrone | 1% BNPN | Clean structures, no gel |

The results demonstrated a dramatic advantage for the nitrone compound which offered the dual properties of being photobleachable and radical scavenging.

What is claimed is:

1. A photosensitive composition which comprises an admixture of a free radical polymerizable acrylate or methacrylate component having at least two ethylenically unsaturated groups selected from the group consisting of ethoxylated bisphenol A diacrylate, 1,6-hexanediol diacrylate and mixtures thereof, a photoinitiator in the form of benzil dimethyl ketal and a nitrone selected from the group consisting of N-tertbutylphenyl nitrone; N-tert-butyl alpha-phenyl nitrone; N-tert-butyl-alpha-(p-nitrophenyl) nitrone; 5,5-dimethyl-1-pyrroline N-oxide; N-phenyl alpha-phenyl nitrone and mixtures thereof, wherein said polymerizable component is present in sufficient amount to provide image differentiation when the composition is imagewise exposed to sufficient actinic radiation ad wherein said nitrone is present in an amount sufficient to inhibit free radical polymerization in the nonexposed areas when the composition is subjected to actinic radiation, which composition bleaches at a rate of from about 0.1% per second to about 90% per second when exposed to sufficient amount of actinic radiation.

2. A photosensitive composition which comprises an admixture of a free radical polymerizable monomer, oligomer or polymer component having at least one ethylenically unsaturated group, a photoinitiator, a nitrone compound, and one or more compounds selected from the group consisting of antioxidants, photostabilizers, volume expanders, fillers, free radical scavengers, contrast enhancers and dyes, wherein said photoinitiator is present in sufficient amount to initiate the free radical polymerization of said polymerizable component upon imagewise exposure to sufficient actinic radiation, wherein said polymerizable component is present in sufficient amount to provide image differentiation when the composition is imagewise exposed to sufficient actinic radiation and wherein said nitrone compound is present in an amount sufficient to inhibit free radical polymerization in the nonexposed areas when the composition is subjected to actinic radiation, which composition bleaches at a rate of from about 0.1% per second to about 90% per second when exposed to sufficient amount of actinic radiation.

3. A photosensitive composition which comprises an admixture of a free radical polymerizable monomer, oligomer or polymer component having at least one ethylenically unsaturated group, a photoinitiator, a nitrone compound, and one or more antioxidants selected from the group consisting of hindered phenols, sulfides, organoboron compounds, organophosphorous compounds and N,N'-hexamethylenebis (3,5-di-ter-butyl-4-hydroxyhydrocinnamamide), wherein said photoinitiator is present in sufficient amount to initiate the free radical polymerization of said polymerizable component upon imagewise exposure to sufficient actinic radiation, wherein said polymerizable component is present in sufficient amount to provide image differentiation when the composition is imagewise exposed to sufficient actinic radiation and wherein said nitrone compound is present in an amount sufficient to inhibit free radical polymerization in the nonexposed areas when the composition is subjected to actinic radiation, which composition bleaches at a rate of from about 0.1% per second to about 90% per second when exposed to sufficient amount of actinic radiation.

4. A photosensitive composition which comprises an admixture of a free radical polymerizable monomer, oligomer or polymer component having at least one ethylenically unsaturated group, a photoinitiator, a nitrone compound, and one or more photostabilizers which is a hindered amine, wherein said photoinitiator is present insufficient amount to initiate the free radical polymerization of said polymerizable component upon imagewise exposure to sufficient actinic radiation, wherein said polymerizable component is present in sufficient amount to provide image differentiation when the composition is imagewise exposed to sufficient actinic radiation and wherein said nitrone compound is present in an amount sufficient to inhibit free radical polymerization in the nonexposed areas when the composition is subjected to actinic radiation, which composition bleaches at a rate of from about 0.1% per second to about 90% per second when exposed to sufficient amount of actinic radiation.

5. A photographic element comprising a substrate selected from the group consisting of silicon, silicon oxide, gallium arsenide, silicon nitride, glass quartz, plastics, and ceramics and crystalline materials, and a photosensitive composition on the substrate, which photosensitive composition comprises a free radical polymerizable composition comprising a free radical polymerizable monomer, oligomer or polymer component having at least one ethylenically unsaturated group, a photoinitiator, and a nitrone compound, wherein said photoinitiator is present in sufficient amount to initiate the free radical polymerization of said polymerizable component upon imagewise exposure to sufficient actinic radiation, wherein said polymerizable component is present in sufficient amount to provide image differentiation when the composition is imagewise exposed to sufficient actinic radiation and wherein said nitrone compound is present in an amount sufficient to inhibit free radical polymerization in the nonexposed areas when the composition is subjected to actinic radiation, which composition bleaches at a rate of from about 0.1% per second to about 90% per second when exposed to a sufficient amount of actinic radiation.

* * * * *